United States Patent
Kobayashi

(10) Patent No.: US 7,821,854 B2
(45) Date of Patent: Oct. 26, 2010

(54) SEMICONDUCTOR MEMORY

(75) Inventor: Hiroyuki Kobayashi, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 175 days.

(21) Appl. No.: 12/239,452

(22) Filed: Sep. 26, 2008

(65) Prior Publication Data

US 2009/0027980 A1 Jan. 29, 2009

Related U.S. Application Data

(63) Continuation of application No. PCT/JP2006/306267, filed on Mar. 28, 2006.

(51) Int. Cl.
*G11C 29/00* (2006.01)
(52) U.S. Cl. ............. 365/200; 365/185.09; 365/189.07; 365/210.1; 365/225.7
(58) Field of Classification Search ................ 365/200, 365/185.09, 189.07, 210.1, 225.7
See application file for complete search history.

(56) References Cited

U.S. PATENT DOCUMENTS

| | | | |
|---|---|---|---|
| 4,538,245 A | 8/1985 | Smarandoiu et al. | |
| 5,617,364 A | 4/1997 | Hatakeyama | |
| 5,677,884 A | 10/1997 | Zagar et al. | |
| 5,740,114 A | 4/1998 | Hirano et al. | |
| 6,065,134 A | 5/2000 | Bair et al. | |
| 6,188,618 B1 | 2/2001 | Takase | |
| 6,434,064 B2 | 8/2002 | Nagai | |
| 7,046,561 B1 * | 5/2006 | Tooher | 365/201 |
| 7,116,590 B2 * | 10/2006 | Blodgett | 365/200 |
| 7,437,625 B2 * | 10/2008 | Roohparvar | 714/710 |
| 2002/0196681 A1 | 12/2002 | Tanizaki | |
| 2004/0141387 A1 | 7/2004 | Hanji et al. | |

FOREIGN PATENT DOCUMENTS

| | | | |
|---|---|---|---|
| JP | 6-44795 A | | 2/1994 |
| JP | 06044798 | * | 2/1994 |
| JP | 2000-11680 A | | 1/2000 |
| JP | 2001-035187 A | | 2/2001 |
| JP | 2002-15593 A | | 1/2002 |
| JP | 2003-007081 | | 1/2003 |
| JP | 2004-220722 A | | 8/2004 |
| KR | 0197990 | | 3/1998 |

\* cited by examiner

*Primary Examiner*—Hoai V Ho
*Assistant Examiner*—Fernando N Hidalgo
(74) *Attorney, Agent, or Firm*—Arent Fox LLP

(57) ABSTRACT

Address comparison circuits each compare the defect addresses programmed in the redundancy fuse circuits with an access address and output a redundancy signal when a comparison result is a match. A switch circuit is controlled to switch according to a redundancy selection signal output from a selection fuse circuit, and validates in response to the redundancy signal either a corresponding regular redundancy line or the reservation redundancy line. By dividing the redundancy lines into the regular redundancy lines and the reservation redundancy line, each of the redundancy fuse circuits can be made to correspond to one of the plurality of redundancy lines with the simple switch circuit. Therefore, a difference in propagation delay time of a signal can be made small and a difference in access time can be made small between when relieving a defect and when there is no defect.

11 Claims, 14 Drawing Sheets

SEMICONDUCTOR MEMORY

CROSS-REFERENCE TO RELATED APPLICATION

This application is a Continuation Application of International Application No. PCT/JP2006/306267, filed Mar. 28, 2006, designating the U.S., the entire contents of which are incorporated herein by reference.

BACKGROUND

1. Field

The present embodiments relate to a semiconductor.

2. Description of the Related Art

A semiconductor memory has a redundancy circuit in order to relieve defects caused by a lattice defect in a substrate and particles produced in a manufacture process and to improve the yield. A semiconductor memory such as a DRAM has a redundancy word line and a redundancy bit line in addition to a normal word line and bit line. When a defect of a memory cell is detected, a fuse circuit formed on the semiconductor memory is programmed in a test process in order to replace a defective word line or a defective bit line with the redundancy word line or the redundancy bit line. By relieving the defective memory cell using the redundancy circuit, the yield of the semiconductor memory is improved. Japanese Laid-open Patent Publication No. H6-44795 and Japanese Laid-open Patent Publication No. 2000-11680 disclose an approach to improve the relief efficiency by decreasing the number of fuse circuits to reduce the chip area and making each fuse circuit usable for a plurality of redundancy word lines or a plurality of redundancy bit lines.

SUMMARY

According to one aspect of embodiments, a semiconductor memory is provided which includes a cell array having memory cells and word lines, bit lines coupled to the memory cells, a plurality of redundancy fuse circuits in which a plurality of defect addresses are programmed respectively, regular redundancy lines provided dedicatedly and respectively corresponding to the redundancy fuse circuits and arranged to relieve a defect, a reservation redundancy line provided in common to the redundancy fuse circuits and arranged to relieve a defect, a plurality of address comparison circuits provided corresponding to the redundancy fuse circuits respectively, each comparing one of the defect addresses programmed in the redundancy fuse circuits with an access address and outputting a redundancy signal when a comparison result is a match, a switch circuit validating in response to the redundancy signal one of a corresponding regular redundancy line and the reservation redundancy line, and a selection fuse circuit outputting a redundancy selection signal to control switching of the switch circuit.

DETAILED DESCRIPTION OF THE EMBODIMENTS

Figure 1:
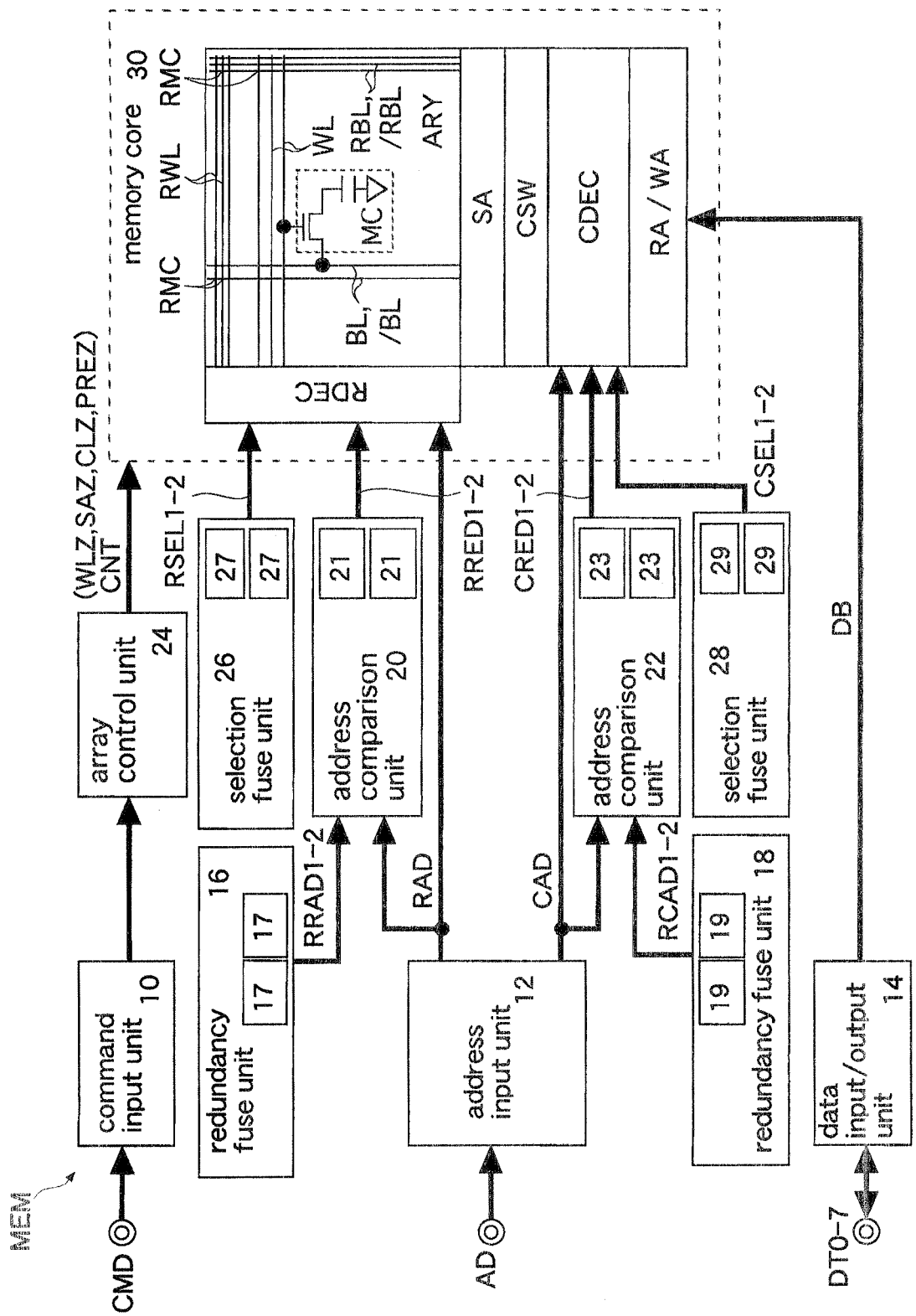
FIG. 1 illustrates a semiconductor memory of a first embodiment.

Fuse circuits corresponding to the redundancy word line and the redundancy bit line are needed respectively. In each fuse circuit, it is necessary to provide every bit of an address with a fuse for programming a defect address. The fuse circuits have been a main cause of increasing the chip size of the semiconductor memory. When there is a defect on the redundancy word line or the redundancy bit line, it is not possible to use the corresponding fuse circuit, and hence the relief efficiency decreases. Freedom for selecting the redundancy word line or the redundancy bit line to be used to relieve a defect is necessary. However, a complicated logic circuit is needed for making the fuse circuit corresponding to a desired redundancy word line or a desired redundancy bit line. As a result, the circuit scale increases. Furthermore, when a delay in the circuit becomes large, the access time when using the redundancy word line or the redundancy bit line becomes longer.

In the drawings, a bold signal line denotes a plurality of signal lines. A part of a block coupled to a bold line is formed by a plurality of circuits. A signal line through which a signal is transferred is denoted by a symbol equal to the name of the signal. In the drawings, double circles denote an external terminal.

FIG. 1 illustrates a semiconductor memory of a first embodiment. The semiconductor memory MEM is, for example, a DRAM having dynamic memory cells. The memory MEM has a command input unit 10, an address input unit 12, a data input/output unit 14, redundancy fuse units 16, 18, address comparison units 20, 22, an array control unit 24, selection fuse units 26, 28 and a memory core 30.

The command input unit 10 receives a command CMD (external access command) supplied to a command terminal CMD, and outputs the received command CMD to the array control unit 24. In this embodiment, a read command, a write command, and a refresh command are supplied as the commands CMD to the command input unit 10.

The address input unit 12 receives an external address AD supplied to an address terminal AD, and outputs the received external address AD as a row address RAD (high-order address) and a column address CAD (low-order address) to the memory core 30. The external address AD indicates a memory cell MC to be accessed. The row address RAD is used to select a word line WL. The column address CAD is used to select bit lines BL, /BL. The row address RAD and the column address CAD are simultaneously supplied to the address terminal AD.

The data input/output unit 14 outputs to a data terminal DT (DT0-7) read data output from the memory core 30 via a data bus DB during a read operation, and outputs write data received at the data terminal DT to the memory core 30 via the data bus DB during a write operation. The data terminal DT is a terminal common to read data and write data.

The redundancy fuse unit 16 has two redundancy fuse circuits 17 for programming redundancy row addresses RRAD1-2 indicating a defective word line WL, respectively. The redundancy fuse unit 18 has two redundancy fuse circuits 19 for programming redundancy column addresses RCAD1-2 indicating a defective bit line pair BL, /BL, respectively. Accordingly, the memory MEM of this embodiment can relief up to four defects.

The address comparison unit 20 has address comparison circuits 21 for comparing the row address RAD received at the address terminal AD with the redundancy row addresses RRAD1-2, respectively. The address comparison circuits 21 activate row redundancy signals RRED1-2 respectively when the comparison result is a match. The address comparison unit 22 has address comparison circuits 23 for comparing the column address CAD received at the address terminal AD with the redundancy column addresses RCAD1-2, respectively. The address comparison circuits 23 activate column redundancy signals CRED1-2 respectively when the comparison result is a match.

The array control unit 24 outputs a control signal CNT for accessing the cell array ARY in response to the command CMD so as to perform an access operation to the memory core 30. As the control signal CNT, there are a word line control signal WLZ for selecting a word line WL, a sense amplifier control signal SAZ for activating a sense amplifier SA, a column line control signal CLZ for selecting a column switch, a precharge control signal PREZ for precharging the bit lines BL, /BL, and the like.

The selection fuse unit 26 has selection fuse circuits 27 for programming respectively whether or not to replace regular redundancy word lines RWL1-2 illustrated in FIG. 2, which will be described later, with a reservation redundancy word line RSVWL. The selection fuse circuits 27 output row redundancy selection signals RSEL1-2 respectively according to a program state.

The selection fuse unit 28 has selection fuse circuits 29 for programming respectively whether or not to replace regular redundancy column lines RCL1-2 illustrated in FIG. 3, which will be described later, with a reservation redundancy column line RSVCL. The selection fuse circuits 29 output column redundancy selection signals CSEL1-2 respectively according to a program state.

The memory core 30 has a row decoder RDEC, a column decoder CDEC, a sense amplifier SA, a column switch CSW, a read amplifier RA, a write amplifier WA and a cell array ARY. The cell array ARY has dynamic memory cells MC, word lines WL and bit line pairs BL, /BL coupled to the dynamic memory cells MC. The memory cells MC are formed respectively at intersections of the word lines WL and the bit line pairs BL, /BL.

Further, the cell array ARY has redundancy memory cells RMC, and three redundancy word lines RWL (RWL1-2, RSVWL illustrated in FIG. 2) and three redundancy bit line pairs RBL, /RBL (bit lines corresponding to RCL1-2, RSVCL illustrated in FIG. 3) which are coupled to the redundancy memory cells RMC. In the diagram, the redundancy bit line pairs RBL, /RBL are each represented by one signal line.

The redundancy memory cells RMC are formed respectively at intersections of the redundancy word lines RWL and the bit line pairs BL, /BL, RBL, /RBL, and at intersections of the redundancy bit line pairs RBL, /RBL and the word lines WL, RWL.

The row decoder RDEC decodes the row address RAD in response to the access command CMD while the row redundancy signals RRED1-2 are inactive, and selects one of the word lines WL. The row decoder RDEC disables decoding of the row address RAD while one of the row redundancy signals RRED1-2 is active, and selects at least one of the redundancy word lines RWL according to logic levels of the row redundancy selection signals RSEL1-2.

The column decoder CDEC decodes the column address CAD in response to the access command CMD while the column redundancy signals CRED1-2 are inactive, and selects eight bit line pairs BL, /BL corresponding to the number of bits of the data terminal DT. The column decoder CDEC disables decoding of the column address CAD while one of the column redundancy signals CRED1-2 is active, and selects at least one of the redundancy bit line pairs RBL, /RBL according to logic levels of the column redundancy selection signals CSEL1-2.

The sense amplifier SA amplifies a difference of signal amounts of data signals read to the bit line pairs BL, /BL. The column switch CSW couples the bit lines BL, /BL to the data bus line DB according to the column address CAD.

The read amplifier RA amplifies complementary read data output via the column switch CSW during a read operation. The write amplifier WA amplifies complementary write data supplied via the data bus DB during a write operation, and supplies the data to the bit line pairs BL, /BL.

Figure 2:
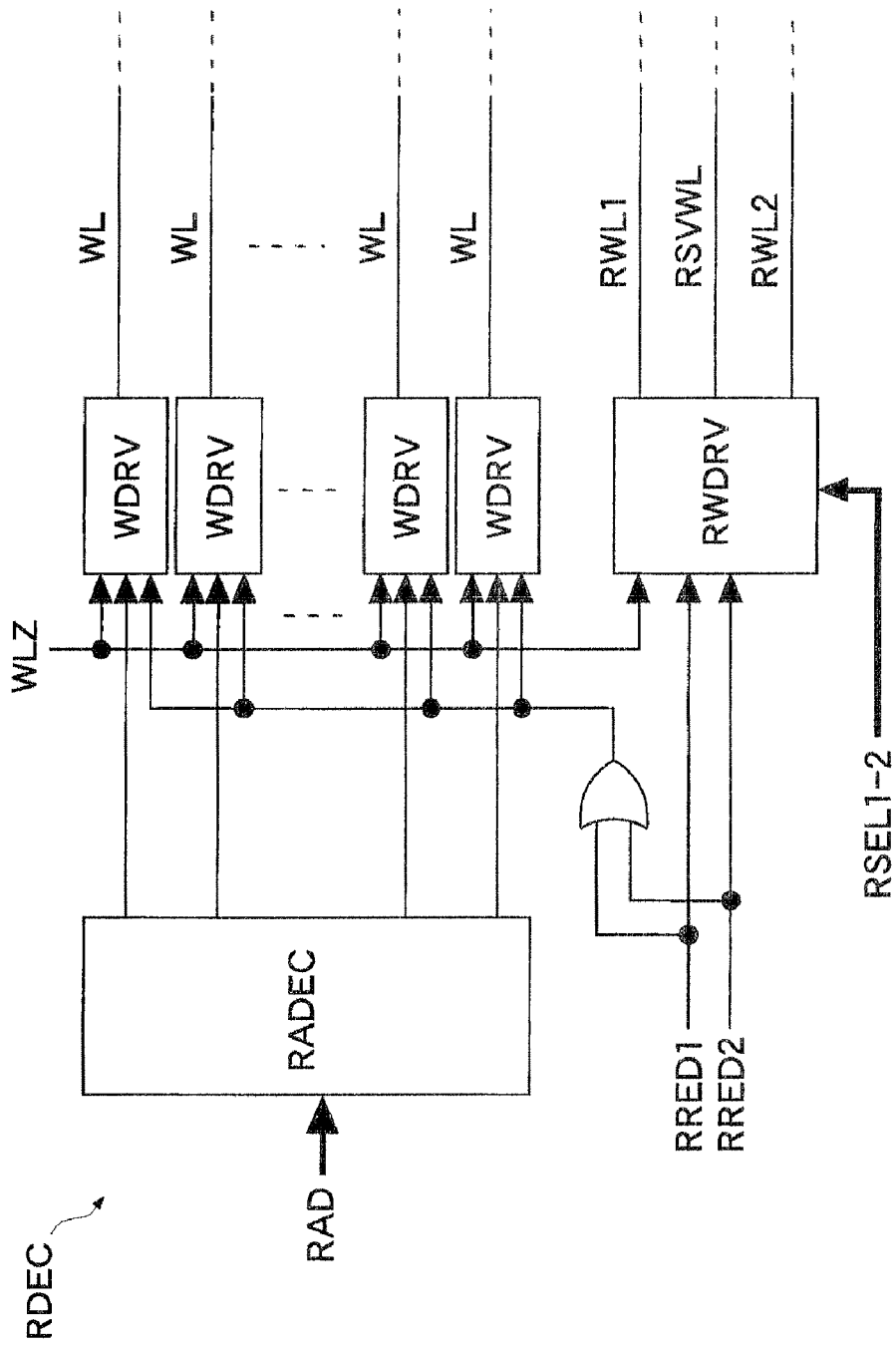
FIG. 2 illustrates details of a row decoder illustrated in FIG. 1.

FIG. 2 illustrates details of the row decoder RDEC illustrated in FIG. 1. The row decoder RDEC has a row address decoder RADEC decoding the row address RAD, word drivers WDRV for supplying high level voltages to the word lines WL respectively, and a redundancy word driver RWDRV for supplying a high level voltage to the regular redundancy word lines RWL1-2 and the reservation redundancy word line RSVWL.

The word drivers WDRV, RWDRV operate synchronously with the word line control signal WLZ, and changes one of the word lines WL, the regular redundancy word lines RWL1-2, and the reservation redundancy word line RSVWL that is accessed to a high level for a predetermined period. When one of the redundancy word lines RWL1-2, RSVWL is used, at least one of the row redundancy signals RRED1-2 is activated in response to the access command CMD for the defective word line WL. The word drivers WDRV are inactivated while the row redundancy signals RRED1-2 are active, and stop the drive operation of the word lines WL.

The redundancy word driver RWDRV supplies a high level voltage to either the regular redundancy word line RWL1 or the reservation redundancy word line RSVWL in response to activation of the row redundancy signal RRED1. Further, the redundancy word driver RWDRV supplies a high level voltage to either the regular redundancy word line RWL2 or the reservation redundancy word line RSVWL in response to activation of the row redundancy signal RRED2. When a defect exists on one of the regular redundancy word lines RWL1-2, one of the selection fuse circuits 27 illustrated in FIG. 1 is programmed, and the row redundancy selection signal RSEL1 or RSEL2 at a low logic level is output.

When the row redundancy selection signal RSEL1 is at a low logic level, activation of the defective regular redundancy word line RWL1 is disabled, and activation of the reservation redundancy word line RSVWL is enabled. When the row redundancy selection signal RSEL2 is at a low logic level, activation of the defective regular redundancy word line RWL2 is disabled, and activation of the reservation redundancy word line RSVWL is enabled. Thus, the redundancy word driver RWDRV has a function of a switch circuit which validates, in response to the row redundancy selection signals RSEL1-2, either the corresponding regular redundancy word lines RWL1-2 or reservation redundancy word line RSVWL. The access operation is then performed using the redundancy word lines RWL1-2, RSVWL instead of the defective word line WL, thereby relieving the defect in the cell array ARY.

Figure 3:
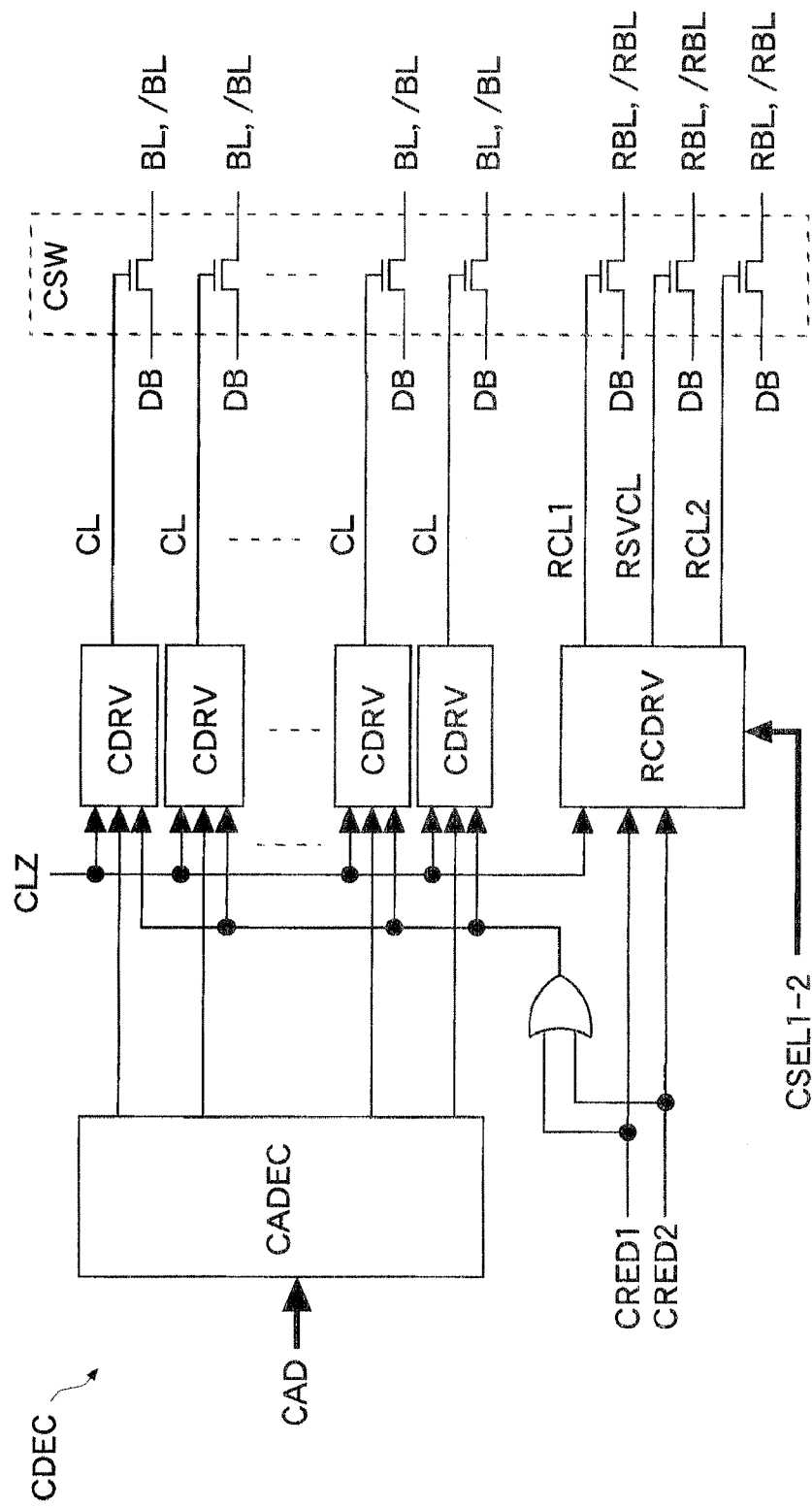
FIG. 3 illustrates details of a column decoder illustrated in FIG. 1.

FIG. 3 illustrates details of the column decoder CDEC illustrated in FIG. 1. The column decoder CDEC has a column address decoder CADEC which decodes the column address CAD, column drivers CDRV for supplying a high voltage level to each of column lines CL, and a redundancy column driver RCDRV for supplying a high level voltage to the regular redundancy column lines RCL1-2 and the reservation redundancy column line RSVCL. The column lines CL are coupled to the column switches CSW coupled to the bit line pairs BL, /BL, and the regular redundancy column lines RCL1-2 and the reservation redundancy column line RSVCL are coupled to the redundancy column switches CSW coupled to the redundancy bit line pairs RBL, /RBL.

The column drivers CDRV operate synchronously with the column line control signal CLZ, and change one of the column lines CL controlling on/off of the column switches CSW to a high level for a predetermined period. The column driver RCDRV operates synchronously with the column line control signal CLZ, and changes one of the regular redundancy column lines RCL1-2 and the reservation redundancy column line RSVCL, which control on/off of the redundancy column switches CSW, to a high level for a predetermined period.

When one of the redundancy column lines RCL1-2, RSVCL is used, at least one of the column redundancy signals CRED1-2 is activated in response to the access command CMD for the defective bit line pair BL, /BL or column line CL. The column drivers CDRV are inactivated while the column redundancy signals CRED1-2 are active, and stop the drive operation of the column lines CL.

The redundancy column driver RCDRV supplies a high level voltage to either the regular redundancy column line RCL1 or the reservation redundancy column line RSVCL in response to activation of the column redundancy signal CRED1. Further, the redundancy column driver RCDRV supplies a high level voltage to either the regular redundancy column line RCL2 or the reservation redundancy column line RSVCL in response to activation of the column redundancy signal CRED2. When a defect exists on one of the redundancy column lines RCL1-2, one of the selection fuse circuits 29 illustrated in FIG. 1 is programmed, and the column redundancy selection signal CSEL1 or CSEL2 at a low logic level is output.

When the column redundancy selection signal CSEL1 is at a low logic level, activation of the defective regular redundancy column line RCL1 is disabled, and activation of the reservation redundancy column line RSVCL is enabled. When the column redundancy selection signal CSEL2 is at a low logic level, activation of the defective regular redundancy column line RCL2 is disabled, and activation of the reservation redundancy column line RSVCL is enabled. Thus, the redundancy column driver RCDRV has a function of a switch circuit which validates, in response to the column redundancy signals CRED1-2, either the corresponding regular redundancy column line RCL2 or reservation redundancy column line RSVCL. The access operation is then performed using the redundancy column lines RCL1-2, RSVCL instead of the defective column line CL, thereby relieving the defect in the cell array ARY.

Figure 4:
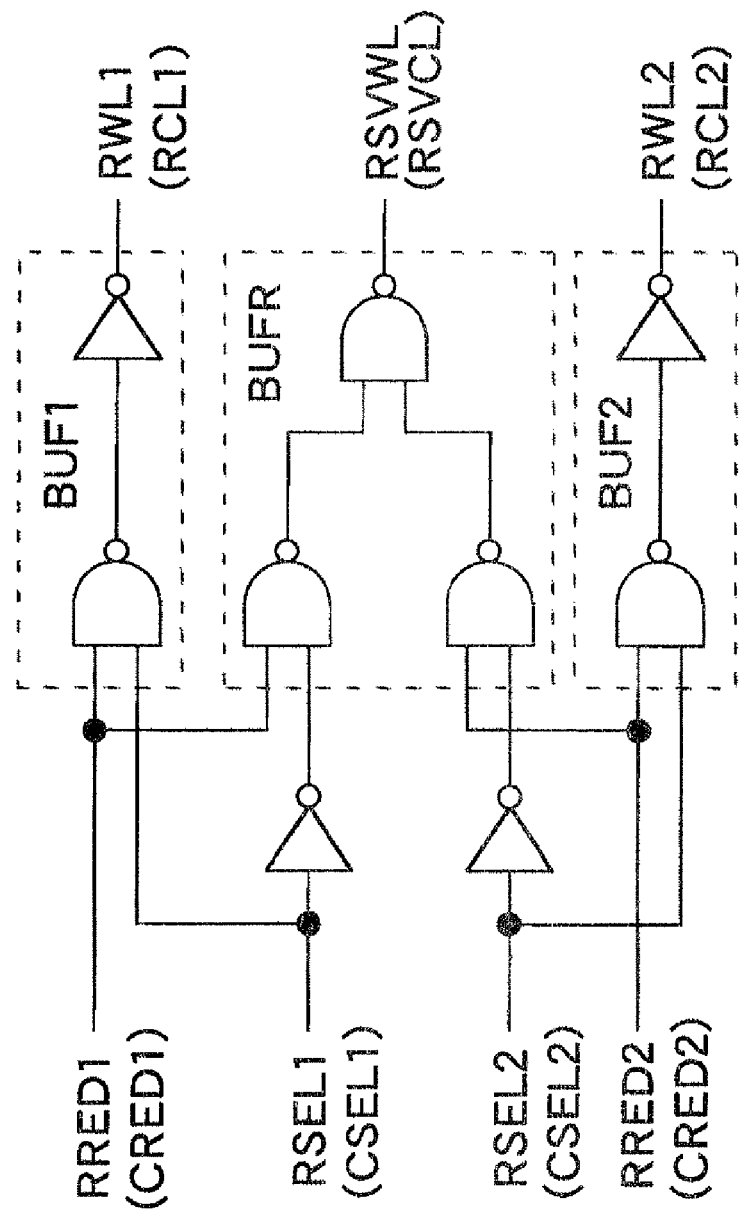
FIG. 4 illustrates details of a redundancy word decoder illustrated in FIG. 2 and a redundancy column decoder illustrated in FIG. 3.

FIG. 4 illustrates details of the redundancy word driver RWDRV illustrated in FIG. 2 and the redundancy column driver RCDRV illustrated in FIG. 3. Substantial parts of the redundancy word driver RWDRV and the redundancy column driver RCDRV have the same logic structure, and hence only the redundancy word driver RWDRV will be explained here.

The redundancy word driver RWDRV has buffers BUF1-2 which drive the regular redundancy word lines RWL1-2 respectively and a buffer BUFR which drives the reservation redundancy word line RSVWL. The buffer BUF1 is used when the row redundancy selection signal RSEL1 is at a high logic level, and the buffer BUF2 is used when the row redundancy selection signal RSEL2 is at a high logic level. The buffer BUFR is used when one of the row redundancy selection signals RSEL1-2 is at a low logic level. Setting of the row redundancy selection signals RSEL1-2 (or the column redundancy selection signals CSEL1-2) to low logic levels at the same time is disabled in the program specification of the selection fuse circuits 27, 29.

As above, in the first embodiment, by providing the regular redundancy word lines RWL1-2 correspondingly respectively to the two redundancy fuse circuits 17 and the reservation redundancy word line RSVWL common to the two redundancy fuse circuits 17, each redundancy fuse circuit 17 can be made to correspond to one of the redundancy word lines RWL1-2, RSVWL with the simple redundancy word driver RWDRV. Accordingly, a difference in propagation delay time of a signal can be made small and a difference in access time can be made small between when relieving a defect and when not relieving a defect (good product). That is to say, a defect can be relieved with a simple circuit without decreasing the performance of the semiconductor memory MEM and the relief efficiency.

Figure 5:
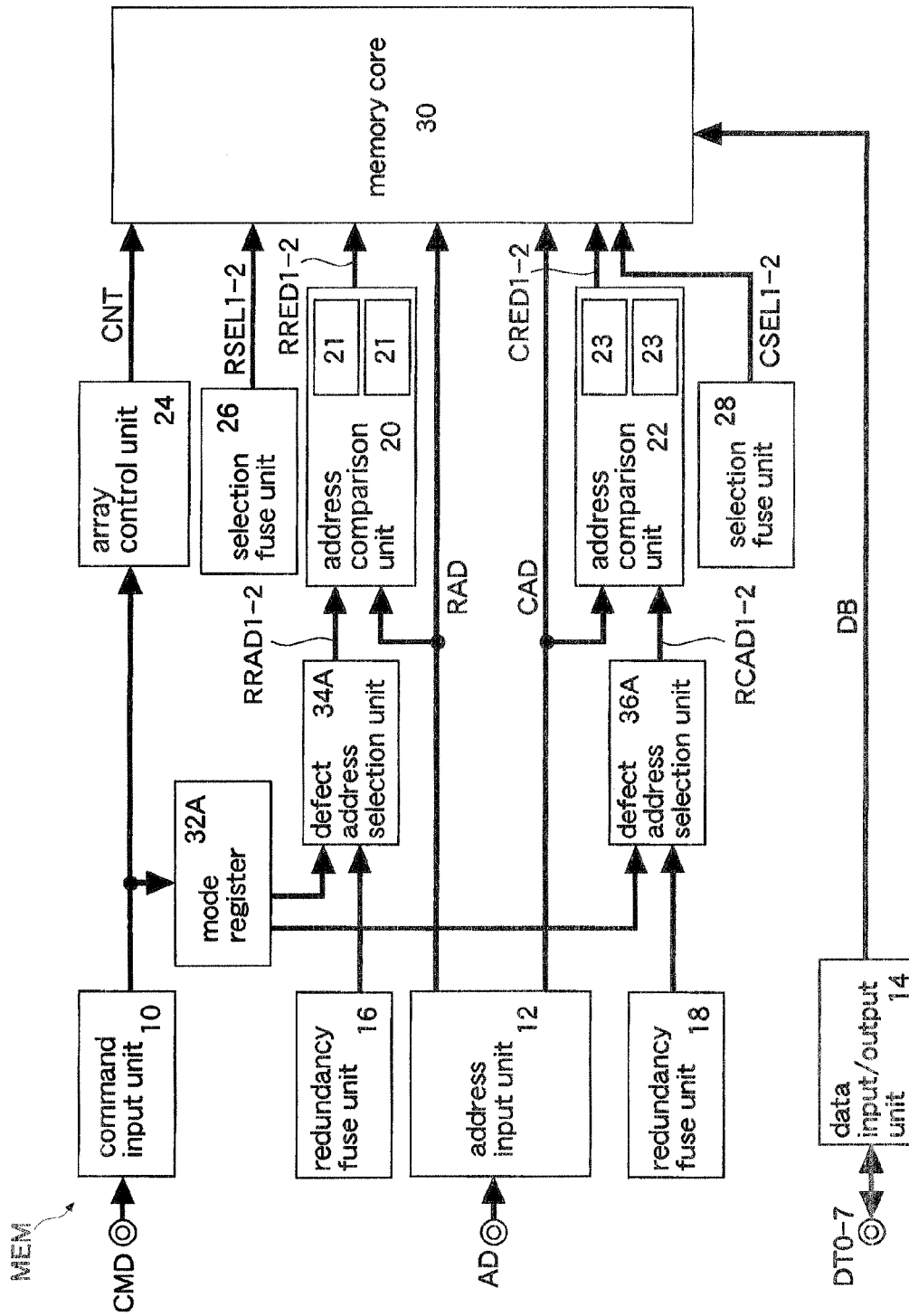
FIG. 5 illustrates a semiconductor memory of a second embodiment.

FIG. 5 illustrates a semiconductor memory of a second embodiment. The same elements as those explained in the first embodiment are given the same symbols, and detailed explanation thereof is omitted. The semiconductor memory MEM of this embodiment is structured by adding a mode register 32A and defect address selection units 34A, 36A to the first embodiment. The other structures are the same as in the first embodiment. Specifically, the semiconductor memory MEM is formed as a DRAM.

The mode register 32A has a memory portion for invalidating outputs of the redundancy fuse units 16, 18 respectively and a memory portion for retaining values (defect address) of tentative redundancy row addresses RRAD1-2 and tentative redundancy column addresses RCAD1-2. The memory portions are rewritable and are set according to the external address AD or the data DT supplied together with a mode register set command. The mode register 32A outputs, according to the values set in the memory portions, a row fuse invalid signal, a column fuse invalid signal, the tentative redundancy row addresses RRAD1-2 and the tentative redundancy column addresses RCAD1-2.

The defect address selection unit 34A invalidates an output of the redundancy fuse unit 16 according to the row fuse invalid signal output from the mode register 32A, and outputs to the address comparison unit 20 the tentative redundancy row addresses RRAD1-2 set in the mode register 32A. The defect address selection unit 36A invalidates an output of the redundancy fuse unit 18 according to the column fuse invalid signal output from the mode register 32A, and outputs to the address comparison unit 22 the tentative redundancy column addresses RCAD1-2 set in the mode register 32A. In other words, the defect address selection units 34A, 36A output either the defect address programmed in the respective redundancy fuse units 16, 18 or the tentative defect addresses retained in the mode register 32A to the corresponding address comparison units 20, 22.

In this embodiment, before programming the redundancy fuse units 16, 18, the tentative redundancy row addresses RRAD1-2 and the tentative redundancy column addresses RCAD1-2 are output to the address comparison units 20, 22, and then the regular redundancy word lines RWL1-2 or the regular redundancy column lines RCL1-2 can be used to relieve the word lines WL or the column lines CL temporarily. Accordingly, whether there is a defect or not on the regular redundancy word lines RWL1-2, the regular redundancy column lines RCL1-2 can be detected before the redundancy fuse units 16, 18 are programmed.

An LSI tester or the like testing the memory MEM can determine whether or not to use the reservation redundancy word line RSVWL and the reservation redundancy column line RSVCL based on the aforementioned detection result. Therefore, after a defect on the redundancy word lines RWL1-2 and the redundancy column lines RCL1-2 is confirmed without using the redundancy fuse units 16, 18, the selection fuse units 26, 28 can be programmed. As a result, programming of the redundancy fuse units 16, 18 and the selection fuse units 26, 28 can be implemented in one test process.

As above, also in the second embodiment, effects similar to those in the above-described first embodiment can be obtained. Furthermore, in this embodiment, programming of the redundancy fuse units 16, 18 and the selection fuse units 26, 28 can be implemented in one test process. As a result, the relief efficiency can be improved with a simple circuit without decreasing the performance of the memory MEM, and the test cost can be reduced.

Figure 6:
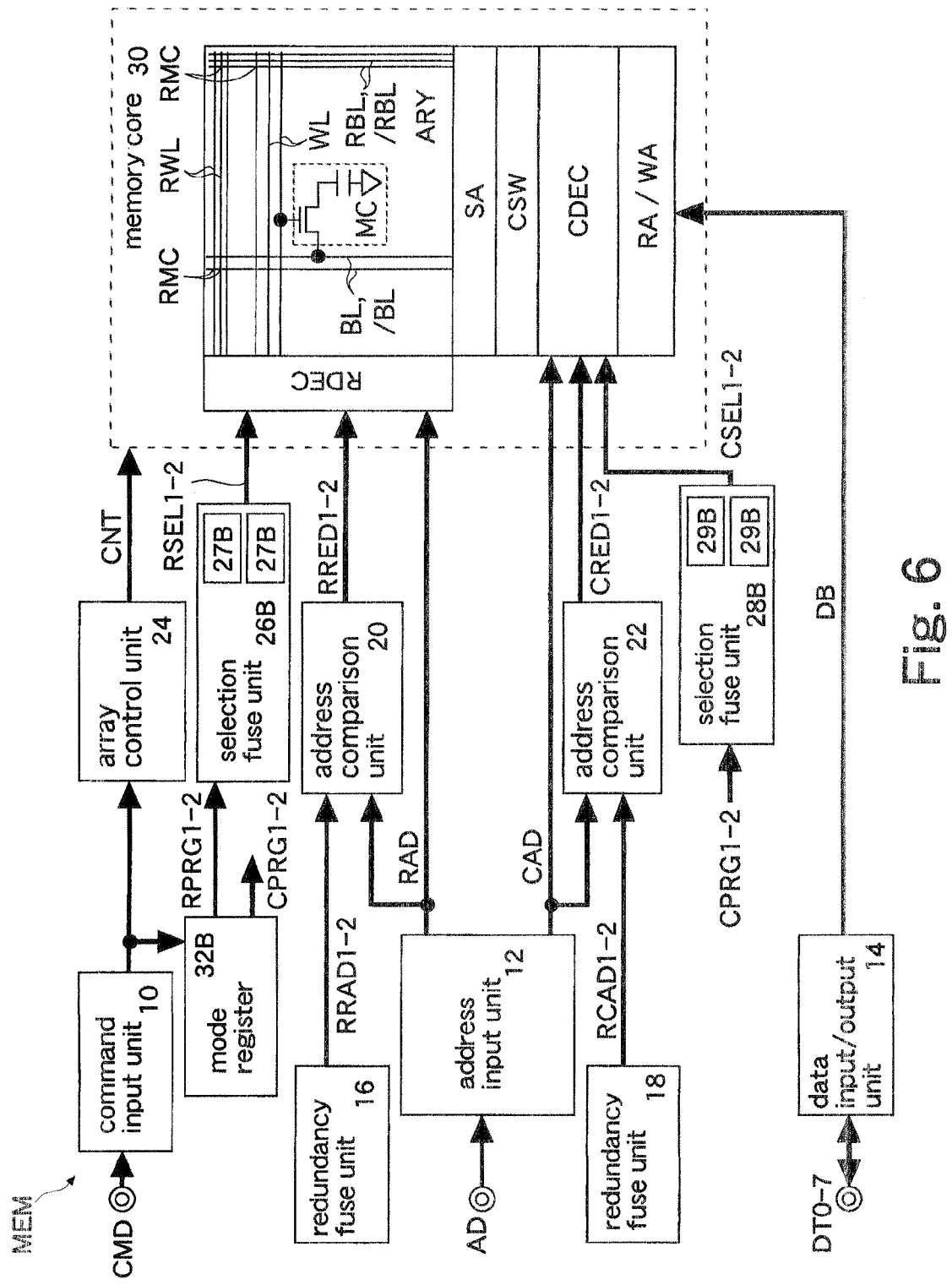
FIG. 6 illustrates a semiconductor memory of a third embodiment.

FIG. 6 illustrates a semiconductor memory of a third embodiment. The same elements as those explained in the first embodiment are given the same symbols, and detailed explanation thereof is omitted. The semiconductor memory MEM of this embodiment has selection fuse units 26B, 28B instead of the selection fuse units 26, 28 of the first embodiment. Further, the semiconductor memory MEM has a mode register 32B. The other structures are the same as in the first embodiment. Namely, the semiconductor memory MEM is formed as a DRAM.

The mode register 32B has a memory portion for retaining values of output invalid signals for invalidating output of the selection signals RSEL1-2, CSEL1-2 corresponding to values programmed in selection fuse circuits 27B, 29B respectively, a memory portion for retaining values of tentative selection signals RSEL1-2, CSEL1-2 respectively, and a program set portion in which program information for programming the selection fuse circuits 27B, 29B is written. The memory portions and the program set portion are set according to the external address AD or the data DT supplied together with a mode register set command when the operation mode of the memory MEM is a test mode.

The mode register 32B outputs, according to the values set in the memory portions, the output invalid signals and the tentative selection signals RSEL1-2, CSE1-2 as program signals RPRG1, CPRG1 to the selection fuse units 26B, 28B respectively. Further, when the program information is written in the program set portion, the mode register 32B outputs corresponding program signals RPRG2, CPRG2. The memory MEM has a not-shown current generation circuit or voltage generation circuit for supplying a large current or a high voltage to the program signal lines RPRG2, CPRG2.

By the large current or the high voltage on the program signal lines RPRG2, CPRG2, the selection fuse circuits 27B, 29B of the selection fuse units 26B, 28B are programmed. Specifically, the mode register 32B functions as a program control circuit which outputs the electrical signals RPRG2, CPRG2 for programming the selection fuse circuits 27B, 29B according to the program information supplied from outside of the memory MEM.

The selection fuse unit 26B has, similarly to the first embodiment, selection fuse circuits 27B for programming respectively whether or not to replace the regular redundancy word lines RWL1-2 (FIG. 2) with the reservation redundancy word line RSVWL. To be programmed according to the electrical signal RPRG2, each selection fuse circuit 27B has a fuse (using an electromigration phenomenon of metal) which is blown by a current or a fuse (using a breakdown voltage of an oxide film or the like) which is conducted or insulated by a voltage. The selection fuse circuits 27B output the row redundancy selection signals RSEL1-2 respectively according to the program state. However, the selection fuse unit 26B disables output of the row redundancy selection signal RSEL1-2 from the fuse circuits 27B according to the output invalid signal output from the mode register 32B, and outputs tentative row redundancy selection signals RSEL1-2 output from the mode register 32B to the memory core 30.

The selection fuse unit 28B has, similarly to the first embodiment, selection fuse circuits 29B for programming respectively whether or not to replace the regular redundancy column lines RCL1-2 (FIG. 3) with the reservation redundancy column line RSVCL. To be programmed according to the electrical signal CPRG2, each selection fuse circuit 29B has a fuse (using an electromigration phenomenon of metal) which is blown by a current or a fuse (using a breakdown voltage of an oxide film or the like) which is conducted or insulated by a voltage. The selection fuse circuits 29B output the column redundancy selection signals CSEL1-2 according to the program state. However, the selection fuse unit 28B disables output of the column redundancy selection signals CSEL1-2 from the selection fuse circuits 298 according to the output invalid signal output from the mode register 32B, and outputs tentative column redundancy selection signals CSEL1-2 output from the mode register 32B to the memory core 30.

In this embodiment, it is possible to detect whether there is a defect or not on the reservation redundancy word line RSVWL illustrated in FIG. 2 and the reservation redundancy column line RSVCL illustrated in FIG. 3 before programming the selection fuse units 26B, 28B. Accordingly, for example, when there are defects on the regular redundancy word line RWL1 and the reservation redundancy word line RSVWL and there are two word lines WL to be relieved, an LSI tester or the like testing the semiconductor memory can determine without programming the selection fuse units 26B, 28B that the defects in this memory MEM cannot be relieved. Therefore, it is possible to prevent programming of the selection fuse units 26B, 28B wastefully.

Furthermore, even after a test process is completed, the selection fuse circuits 27B, 29B can be programmed by writing program information in the program set portion of the mode register 32B. Accordingly, even after the memory MEM is shipped, the reservation redundancy word line RSVWL can be used instead of the regular redundancy word lines RWL1-2, and the reservation redundancy column line RSVCL can be used instead of the regular redundancy column lines RCL1-2. Thus, it is possible to relieve a defect occurred on the regular redundancy word lines RWL1-2 and the regular redundancy column lines RCL1-2 after the test process is completed.

As above, also in the third embodiment, effects similar to those in the above-described first and second embodiments can be obtained. Namely, wasteful programming of the selection fuse units 26B, 28B can be prevented, and the test cost can be reduced. Furthermore, a defect occurred on the redundancy lines RWL1-2, RCL1-2 can be relieved after the test process is completed. As a result, the relief efficiency can be improved with a simple circuit without decreasing the performance of the memory MEM, and the test cost can be reduced.

Figure 7:
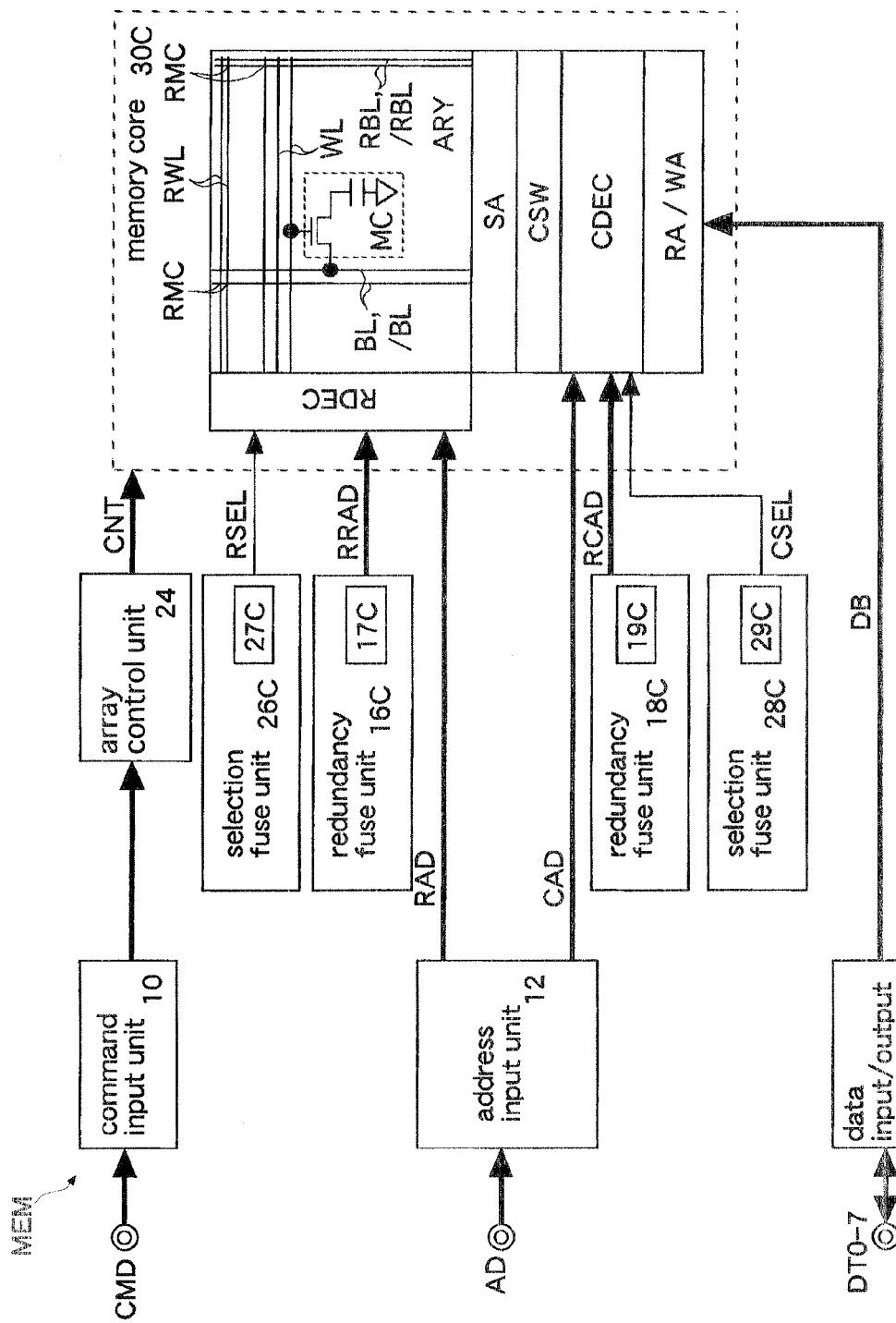
FIG. 7 illustrates a semiconductor memory of a fourth embodiment.

FIG. 7 illustrates a semiconductor memory of a fourth embodiment. The same elements as those explained in the first embodiment are given the same symbols, and detailed explanation thereof is omitted. The semiconductor memory MEM of this embodiment has redundancy fuse units 16C, 18C, selection fuse circuits 26C, 28C and a memory core 30C instead of the redundancy fuse units 16, 18, the selection fuse circuits 26, 28 and the memory core 30 of the first embodiment. Further, the semiconductor memory MEM does not have the address comparison units 20, 22 of the first embodiment. The other structures are the same as in the first embodiment. Namely, the semiconductor memory MEM is formed as a DRAM.

Figure 8:
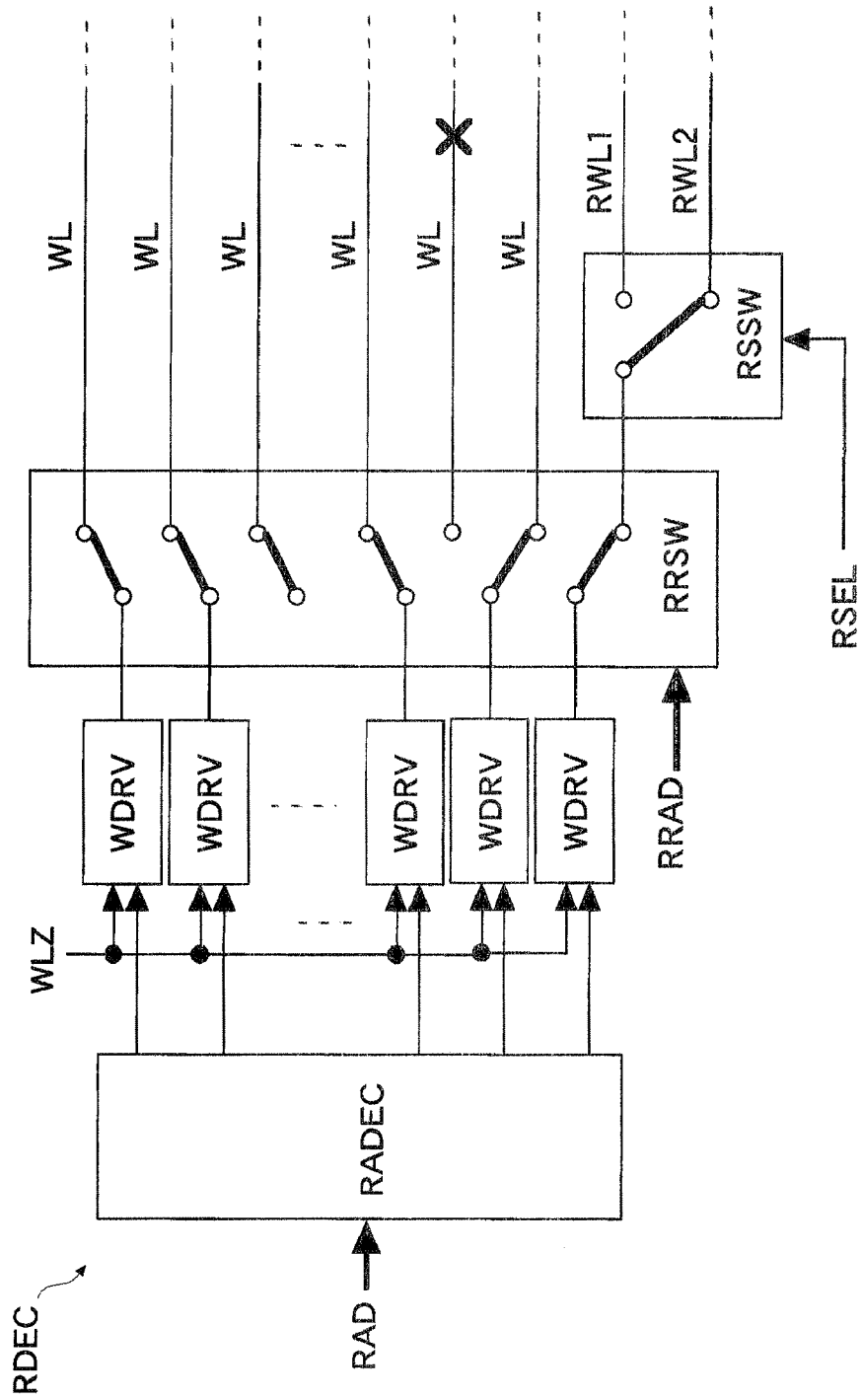
FIG. 8 illustrates details of a row decoder illustrated in FIG. 7.
Figure 9:
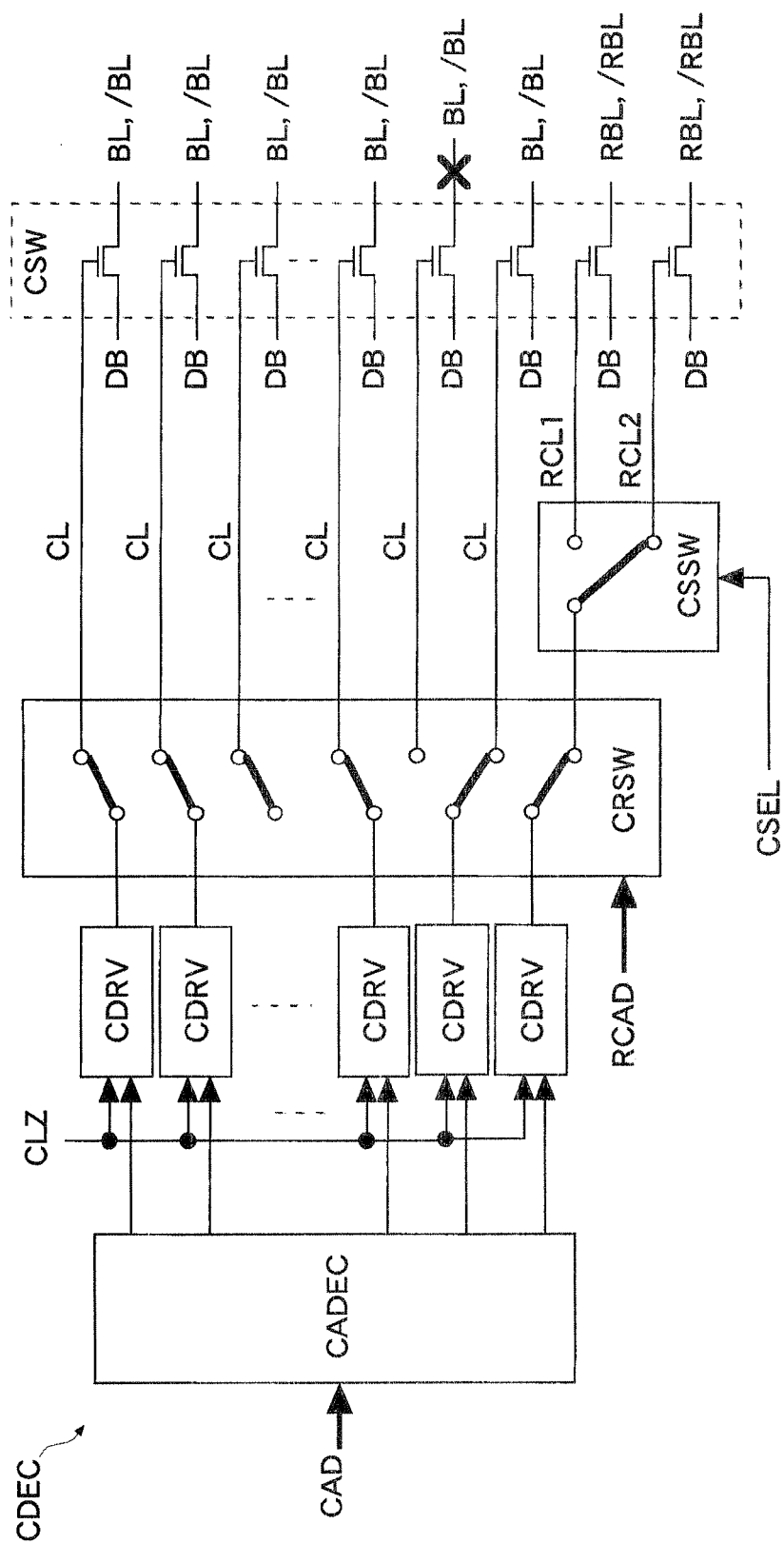
FIG. 9 illustrates details of a column decoder illustrated in FIG. 7.

The memory MEM of this embodiment adopts a so-called shift redundancy system. The memory MEM of the shift redundancy system has a redundancy switch circuit RRSW as illustrated in FIG. 8 which will be described later. The redundancy switch circuit RRSW operates in a power-on sequence of the memory MEM, and couples the word drivers WDRV to the word lines WL, RWL. Similarly, the memory MEM of the shift redundancy system has a redundancy switch circuit CRSW as illustrated in FIG. 9 which will be described later. The redundancy switch circuit CRSW operates in the power-on sequence of the memory MEM, and couples the column drivers CDRV to the column lines CL, RCL. Accordingly, the address comparison units that compare the external address AD and the defect address for every access are not necessary.

The redundancy fuse unit 16C has a fuse circuit 17C for programming a redundancy row address RRAD indicating a defective word line WL, and outputs the programmed redundancy row address RRAD. The redundancy fuse unit 18C has a fuse circuit 19C for programming a redundancy column address RCAD indicating a defective bit line pair BL, /BL, and outputs the programmed redundancy column address RCAD. Using the redundancy fuse units 16C, 18C, up to two defects occurred in the cell array ARY can be relieved.

The selection fuse unit 26C has a selection fuse circuit 27C for programming which of the regular redundancy word lines RWL1-2 illustrated in FIG. 8 is used to relieve a defect. The selection fuse circuit 27C outputs a row redundancy selection signal RSEL at the logic level according to the program state. The selection fuse unit 28C has a selection fuse circuit 29C for programming which of the regular redundancy column lines RCL1-2 illustrated in FIG. 9 is used to relieve a defect. The selection fuse circuit 29C outputs a column redundancy selection signal CSEL at the logic level according to the program state.

The memory core 30C is different from the first embodiment in the row decoder RDEC, the column decoder CDEC and the cell array ARY. The cell array ARY has two redundancy word lines RWL (RWL1-2 illustrated in FIG. 8) and two redundancy bit line pairs RBL, /RBL (bit lines corresponding to RCL1-2 illustrated in FIG. 9). The other structure is the same as in the first embodiment.

FIG. 8 illustrates details of the row decoder RDEC illustrated in FIG. 7. The row decoder RDEC has a row address decoder RADEC, word drivers WDRV, a redundancy switch circuit RRSW, and a selection switch circuit RSSW. In the memory MEM of the shift redundancy system, the redundancy word driver RWDRV dedicated to the redundancy word lines is not formed. The redundancy switch circuit RRSW and the selection switch circuit RSSW are formed by, for example, CMOS transmission gates, and hence have small circuit scales and short propagation delay times.

The switch circuit RRSW couples the word drivers WDRV to the word lines WL and the selection switch circuit RSSW (one of the redundancy word lines RWL1-2) avoiding the defective word line WL (denoted by X in the diagram) indicated by the redundancy row address RRAD. When there is no defect, the word drivers WDRV are coupled to the normal word lines WL but not coupled to the redundancy word lines RWL1-2.

The selection switch circuit RSSW couples the word driver WDRV to the redundancy word line RWL1 when the row redundancy selection signal RSEL is at a low logic level, and couples the word driver WDRV to the redundancy word line RWL2 when the row redundancy selection signal RSEL is at a high logic level. Accordingly, when there is a defect on the redundancy word line RWL2, relieving can be implemented using the redundancy word line RWL1, and when there is a defect on the redundancy word line RWL1, relieving can be implemented using the redundancy word line RWL2.

FIG. 9 illustrates details of the column decoder CDEC illustrate in FIG. 7. The column decoder CDEC has a column address decoder CADEC, column drivers CDRV, a redundancy switch circuit CRSW, and a selection switch circuit CSSW. The column lines CL are coupled to the column switches CSW coupled to the bit line pairs BL, /BL, and the regular redundancy column lines RCL1-2 are coupled to the redundancy column switches CSW coupled to the redundancy bit line pairs RBL, /RBL.

In the memory MEM of the shift redundancy system, the redundancy column driver RCDRV dedicated to the redundancy column lines is not formed. The redundancy switch circuit CRSW and the selection switch circuit CSSW are formed by, for example, CMOS transmission gates, and hence have small circuit scales and short propagation delay times.

The switch circuit CRSW couples the column drivers CDRV to the column lines CL and the selection switch circuit CSSW (one of the redundancy column lines RCL1-2) avoiding the column line CL corresponding to the defective bit line pair BL, /BL (denoted by X in the diagram) indicated by the redundancy column address RCAD. When there is no defect, the column drivers CDRV are coupled to the normal column lines CL and not coupled to the redundancy column lines RCL1-2.

The column drivers CDRV operate, similarly to the first embodiment (FIG. 3), synchronously with the column line control signal CLZ, and change one of the column lines CL controlling on/off of the column switches CSW to a high level for a predetermined period. The column driver RCDRV operates synchronously with the column line control signal CLZ, and changes one of the redundancy column lines RCL1-2 controlling on/off of the redundancy column switches CSW to a high level for a predetermined period.

The selection switch circuit CSSW couples the column driver CDRV to the redundancy column line RCL1 when the column redundancy selection signal CSEL is at a low logic level, and couples the column driver CDRV to the redundancy column line RCL2 when the row redundancy selection signal RSEL is at a high logic level. Accordingly, when there is a defect on the redundancy column line RCL2, relieving can be implemented using the redundancy column line RCL1, and when there is a defect on the redundancy column line RCL1, relieving can be implemented using the redundancy column line RCL2.

As above, also in the fourth embodiment, effects similar to those in the above-described first embodiment can be obtained. Furthermore, in this embodiment, a defect can be relieved by the simple redundancy switch circuits RRSW, CRSW also in the semiconductor memory MEM adopting the shift redundancy system without decreasing the performance of the semiconductor memory MEM and the relief efficiency.

Figure 10:
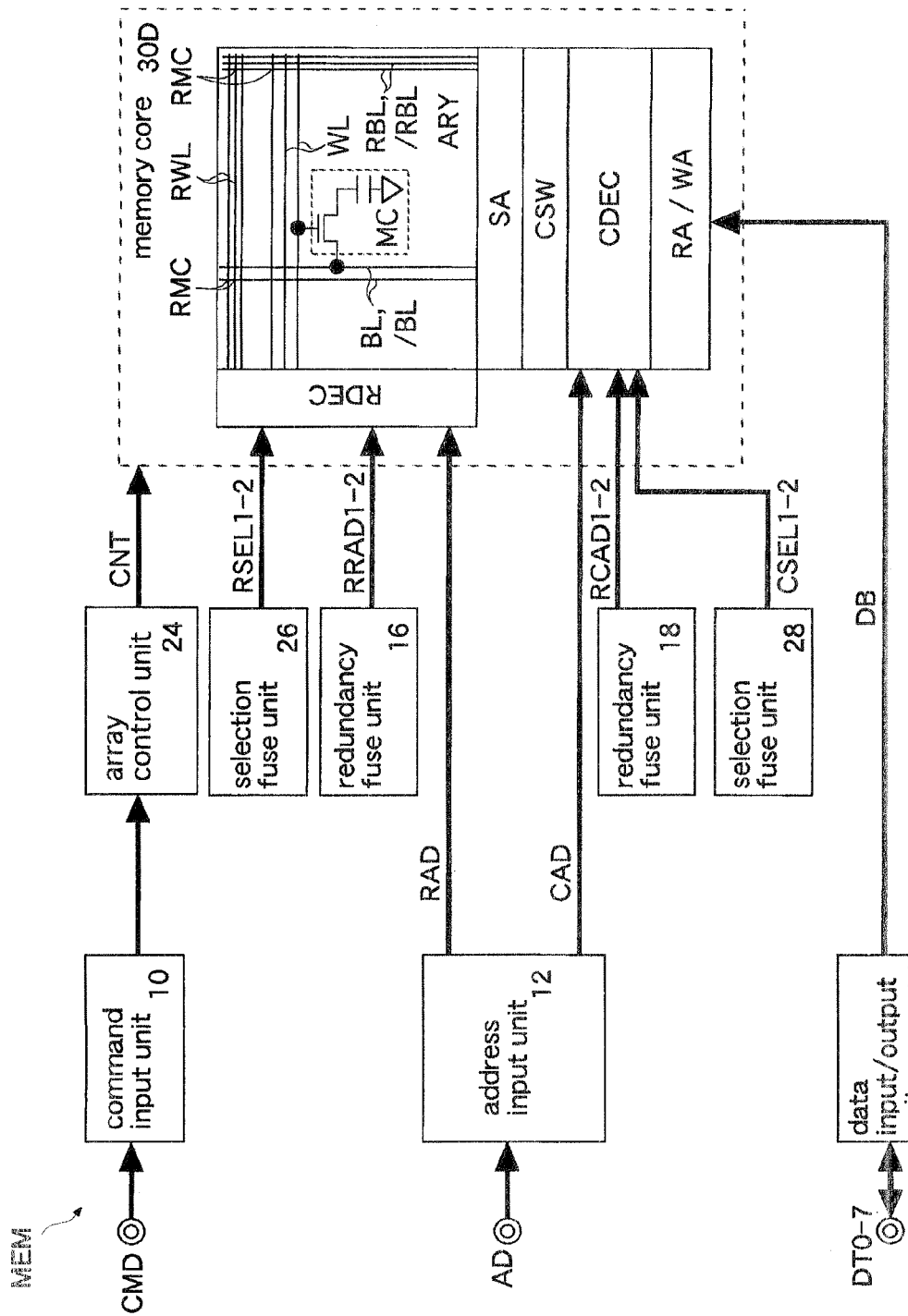
FIG. 10 illustrates a semiconductor memory of a fifth embodiment.

FIG. 10 illustrates a semiconductor memory of a fifth embodiment. The same elements as those explained in the first and second embodiments are give the same symbols, and detailed explanation thereof is omitted. The semiconductor memory MEM of this embodiment has redundancy fuse units 16, 18, selection fuse units 26, 28 and a memory core 30D instead of the redundancy fuse units 16C, 18C, the selection fuse units 26C, 28C and the memory core 30C of the fourth embodiment. The other structures are the same as in the fourth embodiment. Namely, the semiconductor memory MEM is formed as a DRAM.

The redundancy fuse units 16, 18 store, similarly to the first embodiment, two redundancy row addresses RRAD1-2 and two redundancy column addresses RCAD1-2, respectively. The selection fuse units 26, 28 output, similarly to the first embodiment, the row redundancy selection signals RSEL1-2 and the column redundancy selection signals CSEL1-2, respectively. The memory core 30D is different from the fourth embodiment in the redundancy switch circuit RRSW and the selection switch circuit RSSW of the row decoder RDEC, and the redundancy switch circuit CRSW and the selection switch circuit CSSW of the column decoder CDEC. The other structures are the same as in the second embodiment.

Figure 11:
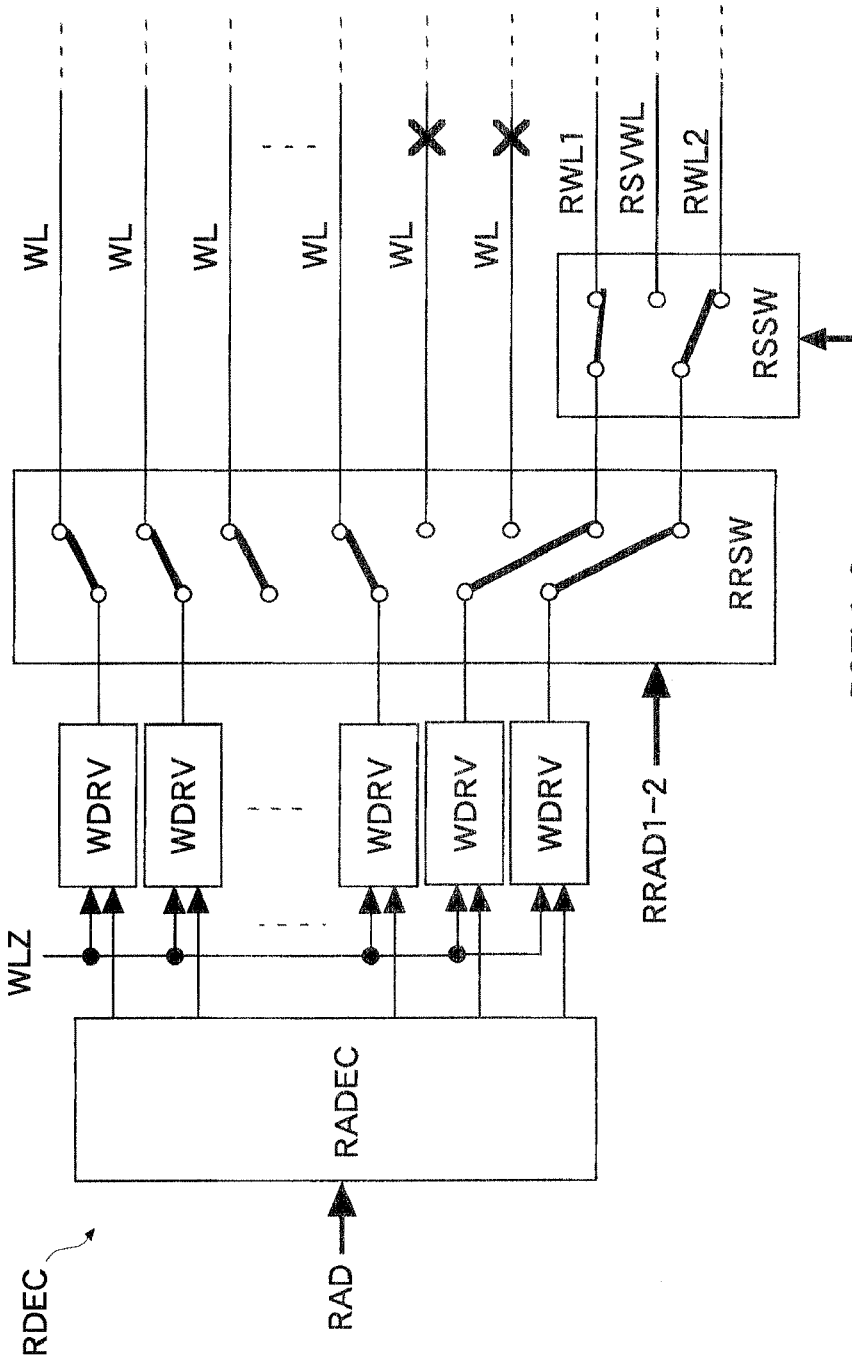
FIG. 11 illustrates details of a row decoder illustrated in FIG. 10.

FIG. 11 illustrates details of the row decoder RDEC illustrated in FIG. 10. In this embodiment, up to two word line defects can be relieved. When there are two word line defects, the switch circuit RRSW couples the word drivers WDRV to the word lines WL and the selection switch circuit RSSW avoiding the defective word lines WL (denoted by X in the diagram) indicated by the redundancy row addresses RRAD1-2. When there is only one word line defect, only one of the word drivers WDRV is coupled to the selection switch circuit RSSW. When there is no word line defect, the word drivers WDRV are coupled to the normal word lines WL but not coupled to the selection switch circuit RSSW.

The selection switch circuit RSSW couples the word driver WDRV to the regular redundancy word line RWL1 when the row redundancy selection signal RSEL1 is at a low logic level, and couples the word driver WDRV to the reservation redundancy word line RSVWL when the row redundancy selection signal RSEL1 is at a high logic level. The selection switch circuit RSSW couples the word driver WDRV to the regular redundancy word line RWL2 when the row redundancy selection signal RSEL2 is at a low logic level, and couples the word driver WDRV to the reservation redundancy word line RSVWL when the row redundancy selection signal RSEL2 is at a high logic level. Each of the regular redundancy word lines RWL1-2 is driven only by the corresponding word driver WDRV, and the reservation redundancy word line RSVWL is used in common by the two word drivers WDRV corresponding to the regular redundancy word lines RWL1-2 and is driven by one of the two word drivers WDRV. Accordingly, when there is a defect on one of the regular redundancy word lines RWL1-2, relieving can be implemented using the reservation redundancy word line RSVWL.

Figure 12:
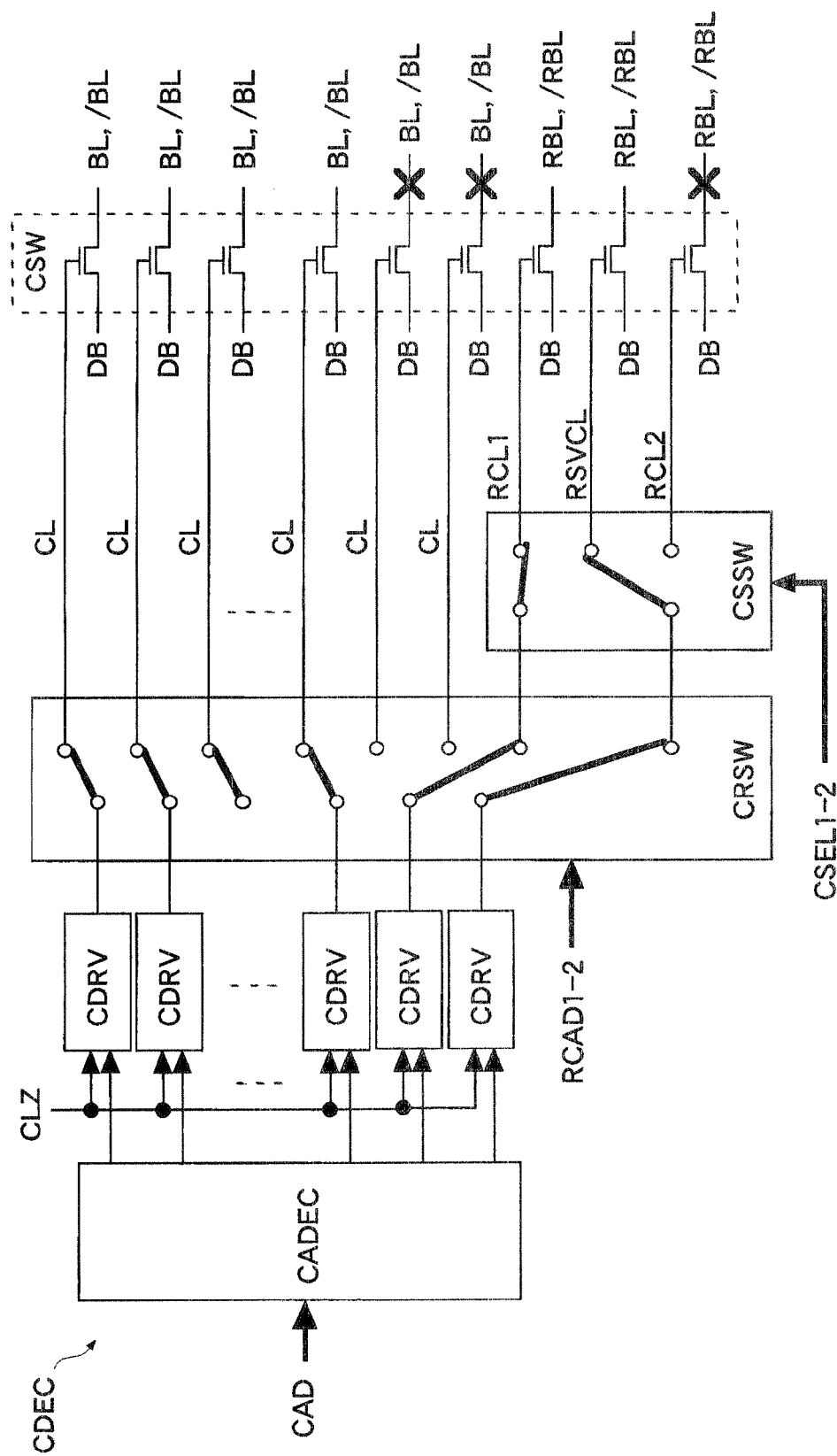
FIG. 12 illustrates details of a column decoder illustrated in FIG. 10.

FIG. 12 illustrates details of the column decoder CDEC illustrated in FIG. 10. In this embodiment, up to two bit line defects can be relieved. When there are two bit line defects, the switch circuit CRSW couples the column drivers CDRV to the column lines CL and the selection switch circuit CSSW avoiding the bit line pairs BL, /BL (denoted by X on the column lines CL in the diagram) corresponding to the defective column lines CL indicated by the redundancy column addresses RCAD1-2. When there is only one bit line defect, only one of the column drivers CDRV is coupled to the selection switch circuit CSSW. When there is no bit line defect, the column drivers CDRV are coupled to the normal column lines CL but not coupled to the selection switch circuit CSSW.

The selection switch circuit CSSW couples the column driver CDRV to the regular redundancy column line RCL1 when the column redundancy selection signal CSEL1 is at a low logic level, and couples the column driver CDRV to the reservation redundancy column line RSVCL when the row redundancy selection signal RSEL1 is at a high logic level. The selection switch circuit CSSW couples the column driver CDRV to the regular redundancy column line RCL2 when the column redundancy selection signal CSEL2 is at a low logic level, and couples the column driver CDRV to the reservation redundancy column line RSVCL when the row redundancy selection signal RSEL2 is at a high logic level. Each of the regular redundancy column lines RCL1-2 is driven only by the corresponding column driver CDRV, and the reservation redundancy column line RSVCL is used in common by the two column drivers CDRV corresponding to the regular redundancy column lines RCL1-2 and is driven by one of the two column drivers CDRV. Accordingly, when there is a defect on one of the regular redundancy column lines RCL1-2, relieving can be implemented using the reservation redundancy column line RSVCL.

Note that in the example illustrated in FIG. 12, there is a defect on the redundancy bit line pair RBL, /RBL corresponding to the regular redundancy column line RCL2. Thus, the selection switch circuit CSSW couples the column driver CDRV not to the regular redundancy column line RCL2 but to the reservation redundancy column line RSVCL.

As above, also in the fifth embodiment, effects similar to those in the above-described first and second embodiments can be obtained. Furthermore, in this embodiment, a defect on the regular redundancy lines RWL1-2, RCL1-2 can be relieved by the simple selection switch circuits RSSW, CSSW. Namely, the relief efficiency can be improved with a simple circuit without decreasing the performance of the memory MEM.

Figure 13:
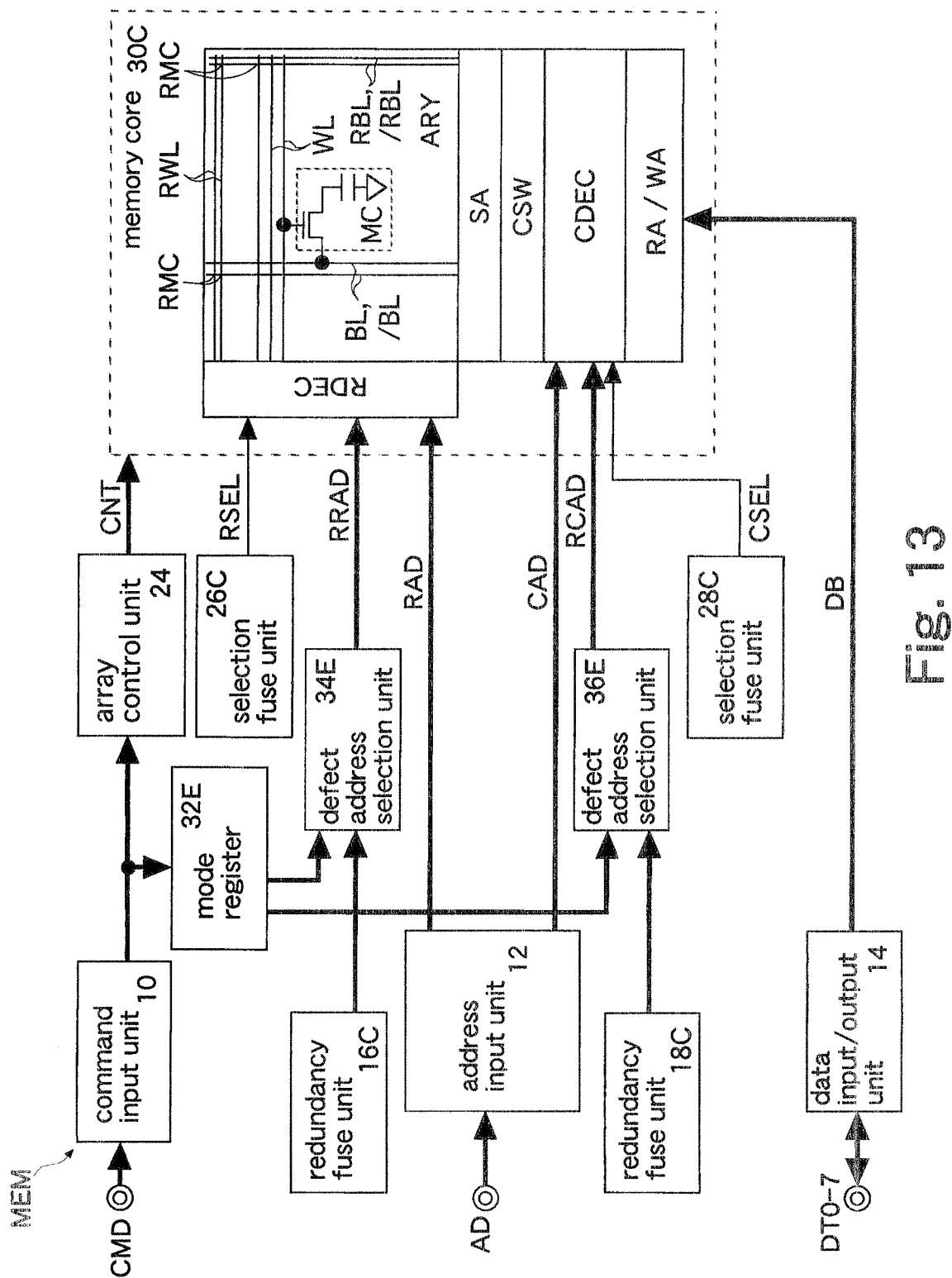
FIG. 13 illustrates a semiconductor memory of a sixth embodiment.

FIG. 13 illustrates a semiconductor memory of a sixth embodiment. The same elements as those explained in the first, second and fourth embodiments are give the same symbols, and detailed explanation thereof is omitted. The semiconductor memory MEM of this embodiment is structured by adding a mode register 32E and defect address selection units 34E, 36E to the fourth embodiment. The other structure is the same as in the fourth embodiment. Namely, the semiconductor memory MEM is formed as a DRAM.

The mode register 32E has a memory portion for invalidating outputs of redundancy fuse units 16C, 18C respectively, and a memory portion for retaining values (defect address) of a tentative redundancy row address RRAD and a tentative redundancy column address RCAD. The memory portions are rewritable and are set according to the external address AD or the data DT supplied together with a mode register set command. The mode register 32E outputs a row fuse invalid signal, a column fuse invalid signal, the tentative redundancy row address RRAD and the tentative column address RCAD according to the values set in the memory portions.

The defect address selection unit 34E invalidates an output of the redundancy fuse unit 16C according to the row fuse invalid signal output from the mode register 32E, and outputs to the memory core 30C the tentative redundancy row address RRAD set in the mode register 32E. The defect address selection unit 36E invalidates an output of the redundancy fuse unit 18C according to the column fuse invalid signal output from the mode register 32E, and outputs to the memory core 30C the tentative redundancy column address RCAD set in the mode register 32E. Specifically, the defect address selection units 34E, 36E output either the defect address programmed in the respective redundancy fuse units 16C, 18C or the tentative defect address retained in the mode register 32E to the redundancy switch circuit RRSW (FIG. 8) of the row decoder RDEC and the redundancy switch circuit CRSW (FIG. 9) of the column decoder CDEC.

In this embodiment, similarly to the second embodiment, the word lines WL or the column lines CL can be relieved temporarily using the tentative redundancy row address RRAD and the tentative redundancy column address RCAD before programming the redundancy fuse units 16C, 18C. Accordingly, whether there is a defect or not on the redundancy word lines RWL1-2 (FIG. 8) and the redundancy column lines RCL1-2 (FIG. 9) can be detected before the redundancy fuse units 16C, 18C are programmed. As above, also in the sixth embodiment, effects similar to those in the above-described first, second and fourth embodiments can be obtained.

Figure 14:
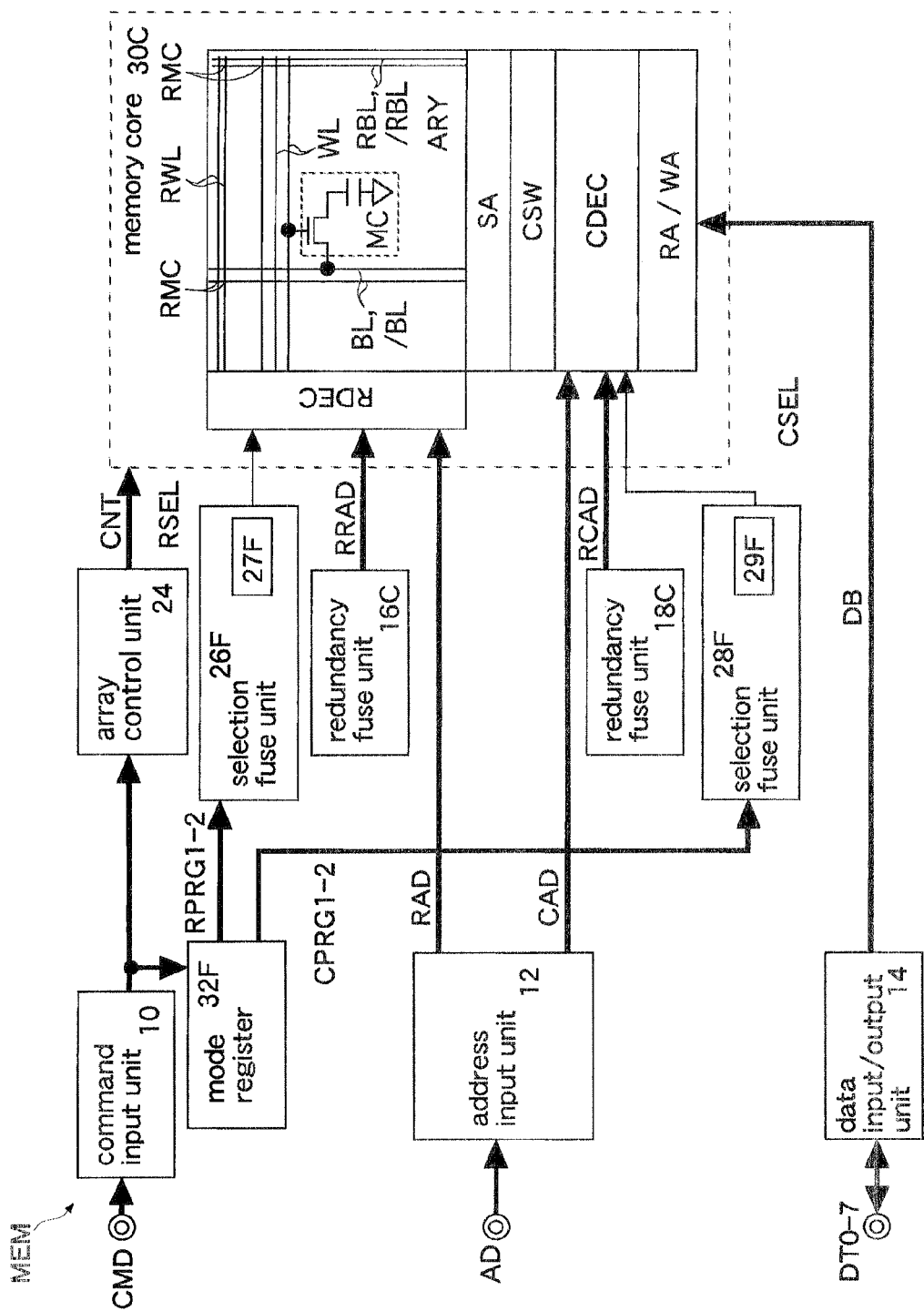
FIG. 14 illustrates a semiconductor memory of a seventh embodiment.

FIG. 14 illustrates a semiconductor memory of a seventh embodiment. The same elements as those explained in the first, third and fourth embodiments are given the same symbols, and detailed explanation thereof is omitted. The semiconductor memory MEM of this embodiment has selection fuse units 26F, 28F instead of the selection fuse units 26C, 28C of the fourth embodiment. Further, the semiconductor memory MEM has a mode register 32F. The other structure is the same as in the fourth embodiment. Namely, the semiconductor memory MEM is formed as a DRAM.

The mode register 32F has a memory portion for retaining values of output invalid signals for invalidating output of the selection signals RSEL, CSEL corresponding to values programmed in the selection fuse units 26F, 28F respectively, a memory portion for retaining values of tentative selection signals RSEL, CSEL respectively, and a program set portion in which program information for programming the selection fuse circuits 27F, 29F is written.

The memory portions and the program set portion are set according to the external AD or the data DT supplied together with a mode register set command when the operation mode of the memory MEM is a test mode.

The mode register 32F outputs, according to the values set in the memory portions, the output invalid signals and the tentative selection signals RSEL, CSEL1 as program signals RPRG1, CPRG1 to the selection fuse units 26F, 28F respectively. Further, when the program information is written in the program set portion, the mode register 32F outputs, similarly to the third embodiment, program signals RPRG2, CPRG2 for programming the selection fuse circuits 27F, 29F when the program information is written in the program set portion. Specifically, the mode register 32F functions as a program control circuit which outputs the electrical signals RPRG2, CPRG2 according to the program information supplied from the outside of the memory MEM. Additionally, the memory MEM has a not-shown current generation circuit or voltage generation circuit for supplying a large current or a high voltage to the program signal lines RPRG2, CPRG2.

To be programmed according to the electrical signals RPRG1-2, the selection fuse circuits 27F, 29F each have a fuse which is blown by a current or a fuse which is conducted or insulated by a voltage. The selection fuse circuit 27F outputs a row redundancy selection signal RSEL according to the program state for using one of the regular redundancy word lines RWL1-2 (FIG. 8). The selection fuse circuit 29F outputs a column redundancy selection signal CSEL according to the program state for using one of the regular redundancy column lines RCL1-2 (FIG. 9).

However, the selection fuse unit 26F disables output of the row redundancy selection signal RSEL from the selection fuse circuit 27F according to the output invalid signal output from the mode register 32F, and outputs the tentative row redundancy selection signal RSEL output from the mode register 32F to the memory core 30C. Further, the selection fuse unit 28F disables output of the column redundancy selection signal CSEL from the selection fuse circuit 29F according to the output invalid signal output from the mode register 32F, and outputs the tentative column redundancy selection signal CSEL output from the mode register 32F to the memory core 30C.

As above, also in the seventh embodiment, effects similar to those in the above-described first, third and fourth embodiments can be obtained. Namely, the relief efficiency can be improved with a simple structure without decreasing the performance of the memory MEM, and the test cost can be reduced.

Note that in the above-described embodiments, examples of applying to a DRAM are described. For example, the embodiments may be applied to a pseudo SRAM, an SRAM, a flash memory or the like. The pseudo SRAM is a memory having memory cells of a DRAM and an input/output interface identical to that of an SRAM, and internally performing a refresh operation of the memory cells automatically. The semiconductor memory applying the above-described embodiments may be of clock asynchronous type or may be of clock synchronous type.

In the above-described first to third, fifth embodiments, there are described examples in which one reservation word line RSVWL is formed for two regular redundancy word lines RWL1-2, and one reservation redundancy column line RSVCL is formed for two regular redundancy column lines RCL1-2. For example, one reservation word line RSVWL may be formed for three regular redundancy word lines RWL, and one reservation redundancy column line RSVCL may be formed for three regular redundancy column lines RCL.

In the above-described embodiments, as an example, both the redundancy circuit for the word lines WL and the redundancy circuit for the column lines CL are described. For example, the embodiments may be applied to one of the redundancy circuit for the word lines WL and the redundancy circuit for the column line CL.

In the above-described third and seventh embodiments, examples of programming the selection fuse units 26B, 28B, 26F, 28F after the test process using the mode registers 32B, 32F are described. For example, it is possible to adopt a circuit structure such that the redundancy fuse units 16, 18, 16C, 18C are programmed after the test process using the mode registers 32B, 32F. In this case, a defect on the normal word lines WL and a defect on the bit lines BL, /BL which occurred after the test process can be relieved.

In the above-described third and seventh embodiments, there are described examples of providing the memory MEM with a function to allow programming after the test process and a function to invalidate the contents programmed in the selection fuse circuits 27B, 29B, 27F, 29F. For example, the memory MEM may be provided with one of the above-described functions.

Further, the features of the third embodiment may be added to the second embodiment. Moreover, the features of the seventh embodiment may be added to the sixth embodiment. Specifically, before programming the redundancy fuse units and the selection fuse units, a defect may be relieved temporarily using a tentative redundancy address and a tentative selection signal. In this case, it is possible to determine in advance a defect that cannot be relieved using the fuse circuits. As a result, the fuse circuits are no longer programmed wastefully, and the test cost can be reduced.

The above-described embodiments may be applied to a semiconductor memory that is molded in a single package, or may be applied to a semiconductor memory mounted on a silicon substrate together with a CPU, a memory controller, or the like (SOC: system on chip). Alternatively, the embodiments may be applied to a semiconductor memory molded in one package together with a CPU, a memory controller, or the like (SIP: system in package).

For example, a cell array has memory cells and word lines, bit lines coupled to the memory cells. Regular redundancy lines are provided dedicatedly and respectively corresponding to redundancy fuse circuits in which defect addresses are programmed. A reservation redundancy line is provided in common to the redundancy fuse circuits. Address comparison circuits each compare the defect addresses programmed in the redundancy fuse circuits with an access address and output a redundancy signal when a comparison result is a match. A switch circuit is controlled to switch according to a redundancy selection signal output from a selection fuse circuit, and validates in response to the redundancy signal either a corresponding regular redundancy line or the reservation redundancy line. By dividing the redundancy lines into the regular redundancy lines and the reservation redundancy line, each of the redundancy fuse circuits can be made to correspond to one of the plurality of redundancy lines with the simple switch circuit. Therefore, a difference in propagation delay time of a signal can be made small and a difference in access time can be made small between when the redundancy lines are used (relieving a defect) and when the redundancy lines are not used (good product). That is to say, a defect can be relieved with a simple circuit without decreasing the performance of the semiconductor memory and the relief efficiency.

For example, a memory core has memory cells, control lines driven by drivers to access the memory cells, and a plurality of redundancy control lines arranged to relieve a defective memory cell or a defective control line. A selection switch circuit couples the drivers selectively to one of the redundancy control lines. A redundancy switch circuit couples outputs of the drivers to the control lines except a control line corresponding to a defect address programmed in a redundancy fuse circuit or to the selection switch circuit. Specifically, in this aspect, a shift redundancy system is adopted. A selection fuse circuit outputs a redundancy selection signal configured to control switching of the selection switch circuit. Accordingly, in a semiconductor memory adopting the shift redundancy system, the redundancy fuse circuit can be made to correspond to one of the plurality of redundancy control lines with the simple redundancy switch circuit. Therefore, a difference in propagation delay time of a signal can be made small and a difference in access time can be made small between when the redundancy lines are used (relieving a defect) and when the redundancy lines are not used (good product). That is to say, a defect can be relieved with a simple circuit without decreasing the performance of the semiconductor memory and the relief efficiency.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor memory, comprising:
   a cell array having memory cells and word lines, bit lines coupled to the memory cells;
   a plurality of redundancy fuse circuits in which a plurality of defect addresses are programmed respectively;
   regular redundancy lines provided dedicatedly and respectively corresponding to the redundancy fuse circuits and arranged to relieve a defect;
   a reservation redundancy line provided in common to the redundancy fuse circuits and arranged to relieve a defect;
   a plurality of address comparison circuits provided corresponding to the redundancy fuse circuits respectively, each comparing one of the defect addresses programmed in the redundancy fuse circuits with an access address and outputting a redundancy signal when a comparison result is a match;
   a switch circuit validating in response to the redundancy signal one of a corresponding regular redundancy line and the reservation redundancy line; and
   a selection fuse circuit outputting a redundancy selection signal to control switching of the switch circuit.

2. The semiconductor memory according to claim 1, further comprising:
   a register retaining a plurality of defect addresses in a rewritable manner; and
   a defect address selection unit outputting one of the defect addresses programmed in the respective redundancy fuse circuits and the corresponding defect addresses retained in the register to the respective address comparison circuits.

3. The semiconductor memory according to claim 1, further comprising a program control circuit outputting according to program information an signal to program the selection fuse circuit.

4. The semiconductor memory according to claim 1, wherein the regular redundancy lines and the reservation redundancy line are redundancy word lines to relieve a defective word line.

5. The semiconductor memory according to claim 1, further comprising:
   a plurality of redundancy bit lines to relieve a defective bit line; and
   redundancy column switches coupled respectively to the redundancy bit lines,
   wherein the regular redundancy lines and the reservation redundancy line are redundancy column lines transmitting a column line control signal controlling on/off of the redundancy column switches.

6. A semiconductor memory, comprising:
   a memory core having memory cells, control lines to access the memory cells, and a plurality of redundancy control lines each to relieve one of a defective memory cell and a defective control line;

a plurality of drivers driving the control lines respectively;

a redundancy fuse circuit in which a defect address is programmed;

a selection switch circuit to couple one of the drivers selectively to one of the redundancy control lines;

a redundancy switch circuit coupling outputs of the drivers to the control lines except a control line corresponding to the defect address programmed in the redundancy fuse circuit and to the selection switch circuit; and a selection fuse circuit outputting a redundancy selection signal to control switching of the selection switch circuit.

7. The semiconductor memory according to claim 6, wherein the redundancy control lines are formed of a plurality of regular redundancy lines corresponding respectively to the drivers and a reservation redundancy line common to the drivers corresponding to the regular redundancy lines.

8. The semiconductor memory according to claim 6, further comprising:

a register retaining a defect address in a rewritable manner; and a defect address selection unit outputting one of the defect address programmed in the redundancy fuse circuit and the defect address retained in the register to the redundancy switch circuit.

9. The semiconductor memory according to claim 6, further comprising a program control circuit outputting according to program information an signal to program the selection fuse circuit.

10. The semiconductor memory according to claim 6, wherein:

the memory core comprises word lines coupled to the memory cells; and the redundancy control lines are redundancy word lines to relieve a defective word line.

11. The semiconductor memory according to claim 6, wherein:

the memory core comprises bit lines coupled to the memory cells, redundancy bit lines to relieve a defective bit line, column switches coupled to the bit lines, and redundancy column switches coupled to the redundancy bit lines; and the redundancy control lines are redundancy column lines transmitting column line control signals controlling on/off of the redundancy column switches.

* * * * *